US012660224B2

(12) United States Patent
Chen et al.

(10) Patent No.: US 12,660,224 B2
(45) Date of Patent: Jun. 16, 2026

(54) SEMICONDUCTOR DEVICE HAVING NON-METAL SEMICONDUCTOR CAPACITOR AND MOS CAPACITOR REGIONS WITH DOPED FIN-SHAPED STRUCTURES AND METHOD FOR FABRICATING THE SAME

(71) Applicant: UNITED MICROELECTRONICS CORP., Hsin-Chu City (TW)

(72) Inventors: Chang-Yih Chen, Tainan City (TW); Kuo-Hsing Lee, Hsinchu County (TW); Chun-Hsien Lin, Tainan City (TW); Kun-Szu Tseng, Tainan City (TW); Sheng-Yuan Hsueh, Tainan City (TW); Yao-Jhan Wang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 363 days.

(21) Appl. No.: 18/368,552

(22) Filed: Sep. 14, 2023

(65) Prior Publication Data

US 2025/0063803 A1 Feb. 20, 2025

(30) Foreign Application Priority Data

Aug. 18, 2023 (TW) ................................. 112131107

(51) Int. Cl.
| | |
|---|---|
| *H10D 30/01* | (2025.01) |
| *H10D 84/01* | (2025.01) |
| *H10D 84/03* | (2025.01) |
| *H10D 84/40* | (2025.01) |

(52) U.S. Cl.
CPC ....... *H10D 30/024* (2025.01); *H10D 84/0158* (2025.01); *H10D 84/038* (2025.01); *H10D 84/403* (2025.01); *H10D 30/0241* (2025.01)

(58) Field of Classification Search
CPC ........... H10D 1/60; H10D 1/66; H10D 30/01; H10D 30/019–0198; H10D 30/024; H10D 30/0241; H10D 30/501–509; H10D 30/62; H10D 84/01; H10D 84/0158; H10D 84/0193; H10D 84/038; H10D 84/217; H10D 84/403; H10D 84/811; H10D 84/813
See application file for complete search history.

(56) References Cited

U.S. PATENT DOCUMENTS

| | | | |
|---|---|---|---|
| 9,076,719 B2 | 7/2015 | Segalman et al. | |
| 10,879,241 B2 | 12/2020 | Glass et al. | |
| 2019/0067477 A1* | 2/2019 | Liu ...................... | H10D 30/795 |

* cited by examiner

*Primary Examiner* — Cheung Lee
(74) *Attorney, Agent, or Firm* — Winston Hsu

(57) ABSTRACT

A method for fabricating a semiconductor device includes the steps of first providing a substrate having a non-metal-oxide semiconductor capacitor (non-MOSCAP) region and a MOSCAP region, forming a first fin-shaped structure on the MOSCAP region, performing a monolayer doping (MLD) process on the first fin-shaped structure, and then performing an anneal process for driving dopants into the first fin-shaped structure. Preferably, the MLD process is further accomplished by first performing a wet chemical doping process on the first fin-shaped structure and then forming a cap layer on the non-MOSCAP region and the MOSCAP region.

9 Claims, 7 Drawing Sheets

SEMICONDUCTOR DEVICE HAVING NON-METAL SEMICONDUCTOR CAPACITOR AND MOS CAPACITOR REGIONS WITH DOPED FIN-SHAPED STRUCTURES AND METHOD FOR FABRICATING THE SAME

BACKGROUND OF THE INVENTION

1. Field of the Invention

The invention relates to a method for fabricating semiconductor device, and more particularly, to a method of using a monolayer doping (MLD) technique for fabricating a metal-oxide-semiconductor capacitor (MOSCAP) device.

2. Description of the Prior Art

Capacitor structure such as MOSCAP structures from semiconductor devices are typically incorporated from gate structure elements of metal-oxide semiconductor field effect transistors (MOSFETs). The fabrication of a typical MOSCAP structure could be accomplished by depositing a metal layer serving as a bottom electrode on a substrate, an insulating layer such as oxide layer on the bottom electrode, and a binary metal layer serving as top electrode on the oxide layer.

Typically, a thermal anneal process is conducted on the binary metal layer so that the metal layer could have adequate work function to be applied in MOSCAP devices. For instance, work function applied to MOSCAP in p-type and n-type MOS devices could be not less than 4.7 eV and not greater than 4.3 eV. However, the thermal anneal process conducted could induce transformations in layers other than the binary metal layer and results in chemical degeneration or physical embrittlement. Moreover, thermal treatment such as heating or thermal anneal processes conducted on other layers could also results in damages to binary metal layer having poor thermal instability. Accordingly, it becomes necessary to strictly control temperatures, duration, and atmospheres of thermal anneal process in fabricating MOSCAP structures, which not only increases difficulty but also cost of the process. Hence, how to come up with a novel MOSCAP device for resolving the above issues has become an important task in this field.

SUMMARY OF THE INVENTION

According to an embodiment of the present invention, a method for fabricating a semiconductor device includes the steps of first providing a substrate having a non-metal-oxide semiconductor capacitor (non-MOSCAP) region and a MOSCAP region, forming a first fin-shaped structure on the MOSCAP region, performing a monolayer doping (MLD) process on the first fin-shaped structure, and then performing an anneal process for driving dopants into the first fin-shaped structure. Preferably, the MLD process is further accomplished by first performing a wet chemical doping process on the first fin-shaped structure and then forming a cap layer on the non-MOSCAP region and the MOSCAP region.

According to another aspect of the present invention, a semiconductor device includes a substrate comprising a non-metal-oxide semiconductor capacitor (non-MOSCAP) region and a MOSCAP region, a first fin-shaped structure on the non-MOSCAP region, and a second fin-shaped structure on the MOSCAP region. Preferably, the first fin-shaped structure includes a maximum concentration of dopants at a first depth and the second fin-shaped structure includes a maximum concentration of dopants at a surface thereof.

These and other objectives of the present invention will no doubt become obvious to those of ordinary skill in the art after reading the following detailed description of the preferred embodiment that is illustrated in the various figures and drawings.

DETAILED DESCRIPTION

Figures 1, 2:
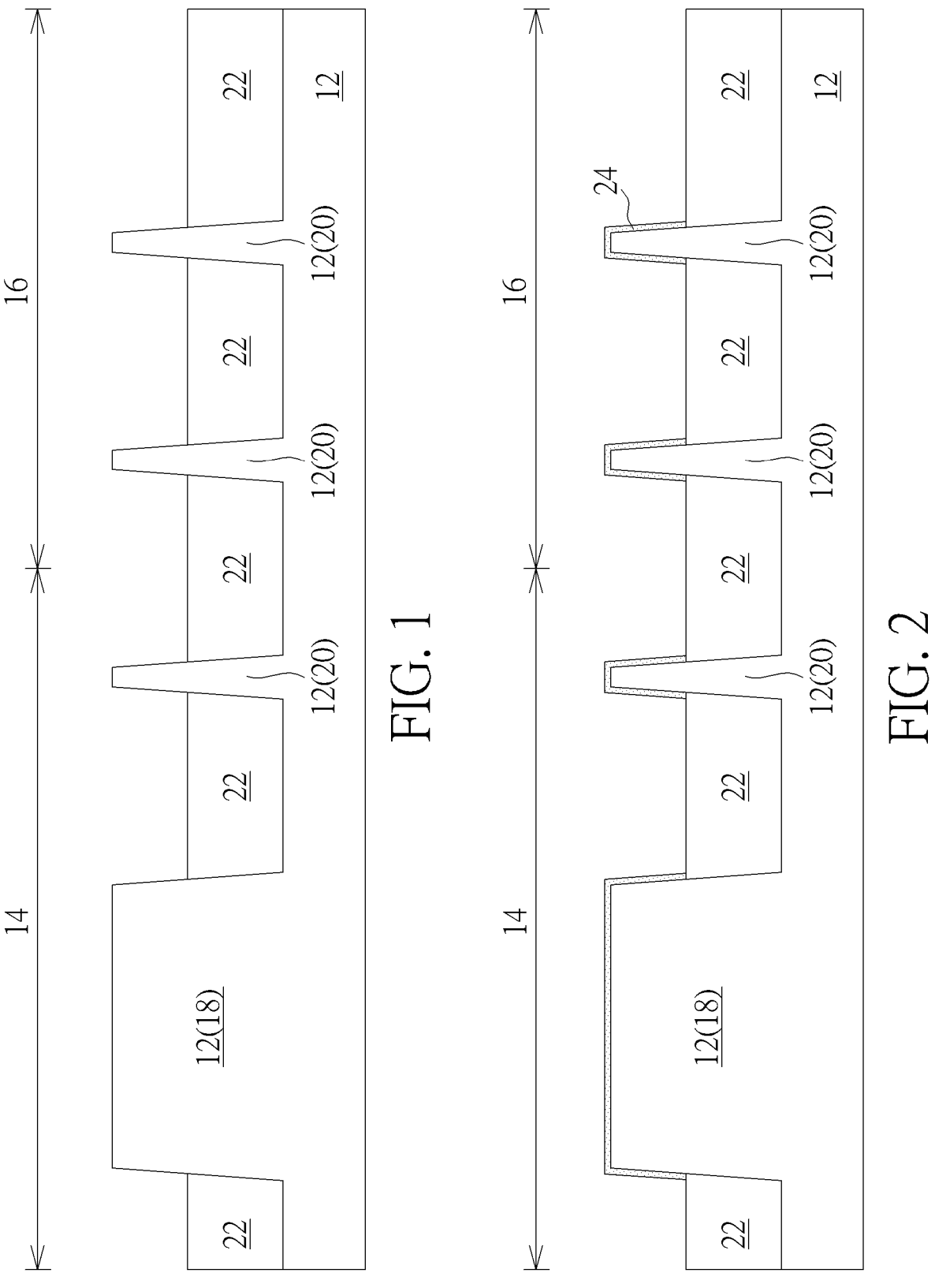
FIGS. 1-7 illustrate a method for fabricating a semiconductor device according to an embodiment of the present invention.

Referring to FIGS. 1-7, FIGS. 1-7 illustrate a method for fabricating a semiconductor device according to an embodiment of the present invention. As shown in FIG. 1, a substrate 12 such as a silicon substrate or silicon-on-insulator (SOI) substrate is provided and two or more regions including a non-MOSCAP region 14 and a MOSCAP region 16 are defined on the substrate 12, in which the non-MOSCAP region 14 could be used for fabricating input/output (I/O) devices of low-voltage (LV) devices while the MOSCAP region 16 could be used for fabricating a MOSCAP device in the later process.

Next, a base 18 and fin-shaped structure 20 are formed on the non-MOSCAP region 14 and a plurality of fin-shaped structures 20 are formed on the substrate 12 of the MOSCAP region 16. Preferably, the fin-shaped structures 20 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the base 18 and the fin-shaped structures 20 could also be obtained by first forming a patterned mask (not shown) on the substrate, 12, and through an etching process, the pattern of the patterned mask is transferred to the substrate 12 to form the base 18 and the fin-shaped structures 20. Moreover, the formation of the base 18 and the fin-shaped structures 20 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding the base 18 and fin-shaped structures 20. These approaches for forming the base 18 and fin-shaped structures 20 are all within the scope of the present invention.

Next, a flowable chemical vapor deposition (FCVD) process is conducted to form an insulating layer (not shown) made of silicon oxide on the base 18 and the fin-shaped structures 20 and filling the trenches between the base 18 and the fin-shaped structures 20, and a planarizing process such as chemical mechanical polishing (CMP) process along with an etching process are conducted to remove part of the insulating layer for forming a shallow trench isolation 22.

Figures 3, 4:
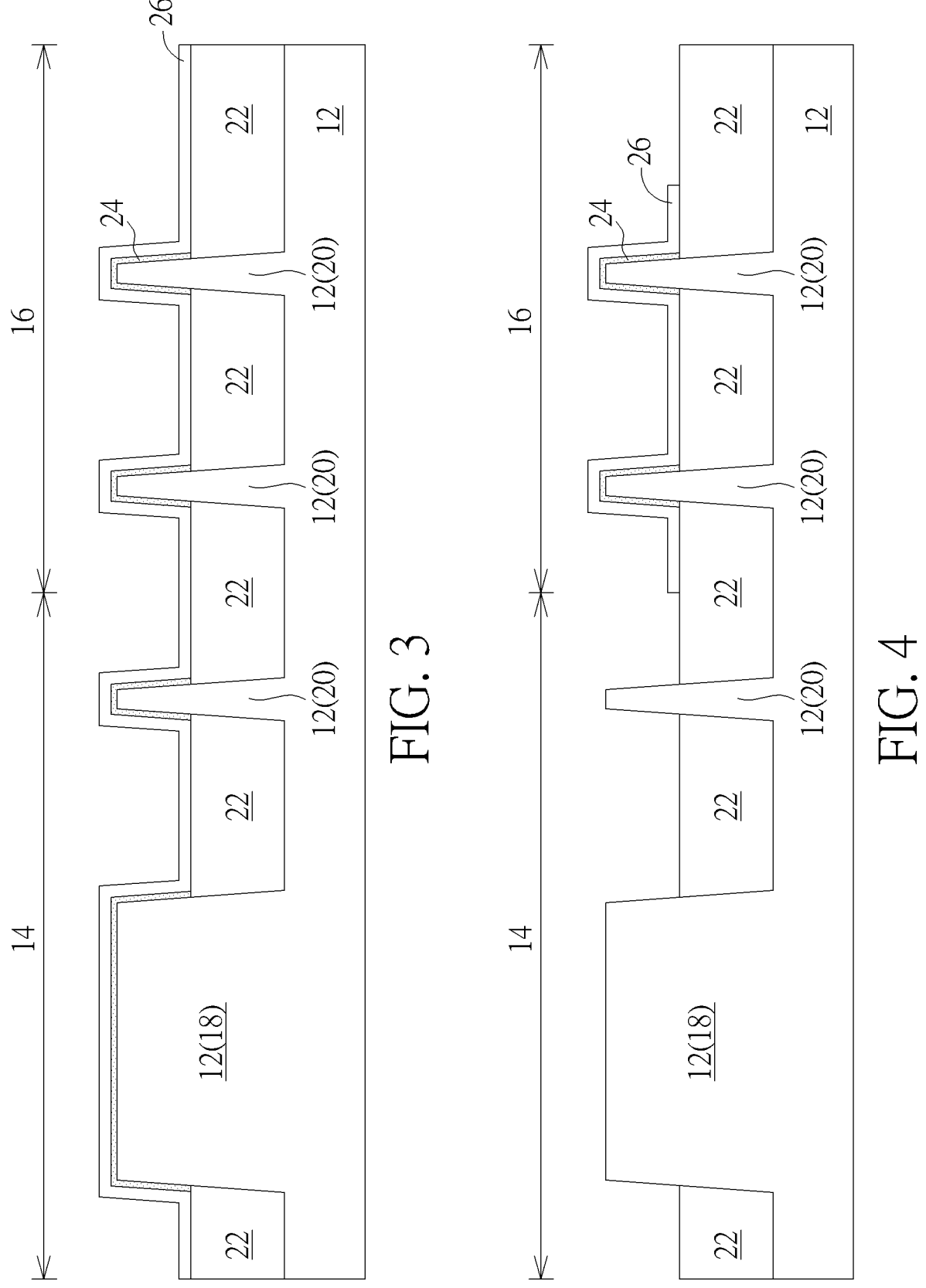

Next, as shown in FIGS. 2-3, a monolayer doping (MLD) process is conducted to form a doped layer 24 on the surface of the base 18 and fin-shaped structures 20 on the non-MOSCAP region 14 and MOSCAP region 16. Specifically, the MLD process conducted at this stage is accomplished by first using diluted hydrofluoric acid (dHF) to clean impurities remained on the surface of the fin-shaped structures 20, and then conducting a wet chemical doping process to inject a precursor containing phosphorus into the surface of the fin-shaped structures 20 on the non-MOSCAP region 14 and MOSCAP region 16 for forming a doped layer 24. In this embodiment, the precursor containing phosphorus preferably includes allyldiphenylphosphine (ADP) or diethyl vinylphosphonate (DVP).

Next, as shown in FIG. 3, a cap layer 26 is formed on the base 18 and fin-shaped structures 20 on the non-MOSCAP region 14 and MOSCAP region 16 as well as on the surface of the doped layer 24. In this embodiment, the cap layer 26 preferably includes silicon oxide, but not limited thereto.

Next, as shown in FIG. 4, a photo-etching process is conducted by first forming a patterned mask (not shown) such as patterned resist on the MOSCAP region 16, and then conducting an etching process by using the patterned mask as mask to remove all of the cap layer 26 and doped layer 24 on the non-MOSCAP region 14 and even part of the cap layer 26 on the MOSCAP region 16 for exposing the base 18 and fin-shaped structures 20 underneath. The patterned mask on the MOSCAP region 16 is then stripped thereafter.

Figure 5:
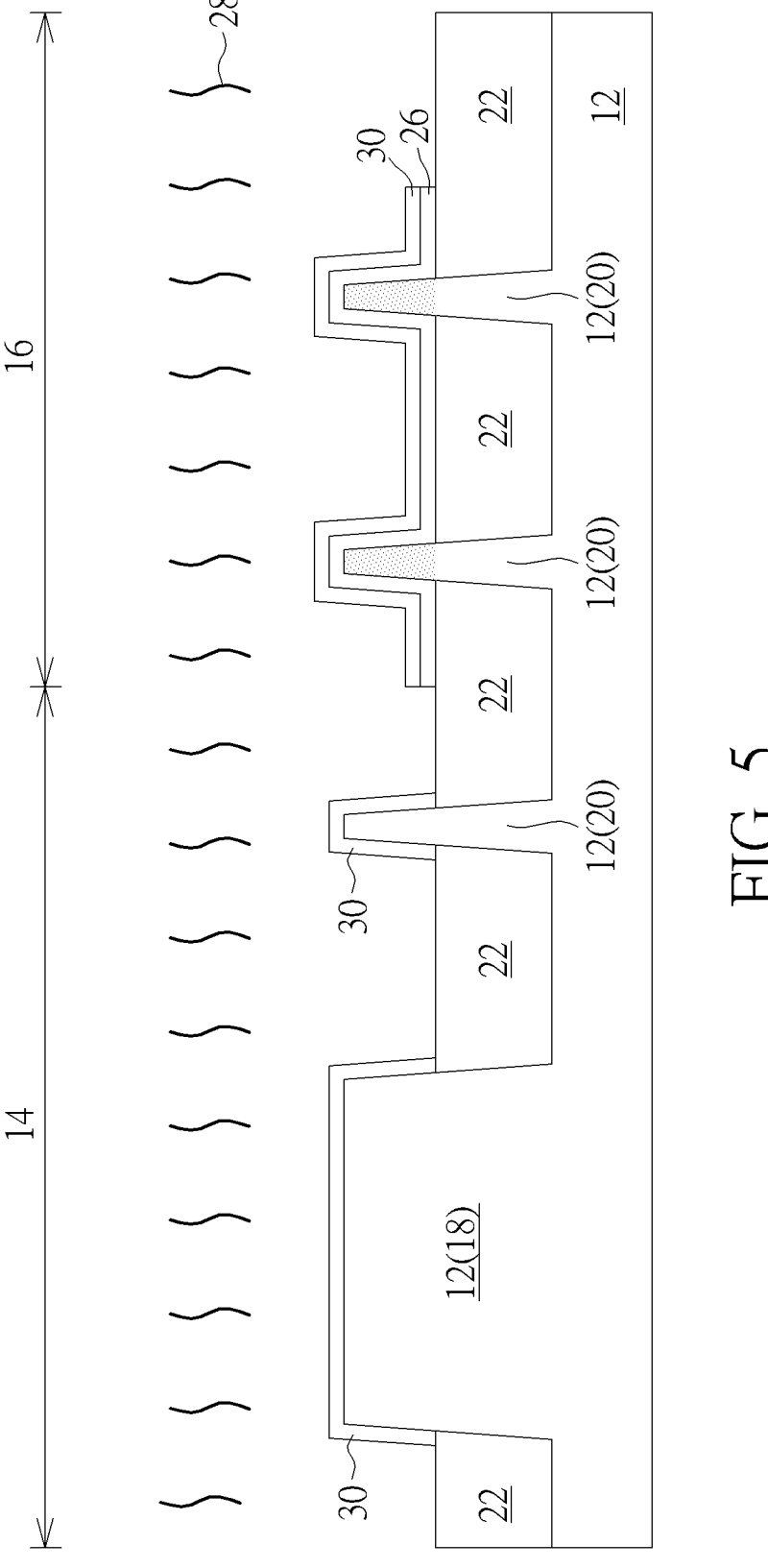

Next, as shown in FIG. 5, an anneal process 28 is conducted to drive the dopants such as phosphorus in the doped layer 24 into the fin-shaped structure 20 for forming a doped region (not shown), which could be serving as a bottom electrode for the MOSCAP device in the later process. The cap layer 26 could be removed or not removed depending on the demand of the process. It should be noted that after the dopants are driven from the doped layer 24 into the fin-shaped structures 20 through the anneal process 28, the doped layer 24 which was originally made of phosphorus is consumed entirely at the same as phosphorus are transferred into the fin-shaped structures 20. As a result, the cap layer 26 is now contacting the surface of the fin-shaped structures 20 directly and in the case when the cap layer 26 is removed, the surface of the fin-shaped structures 20 would be exposed instead.

Next, an oxide growth process such as a rapid thermal oxidation (RTO) process or an in-situ steam generation (ISSG) is conducted to form a gate oxide layer 30 made of silicon oxide on the substrate 12 and fin-shaped structures 20 on the non-MOSCAP region 14 and MOSCAP region 16. It should be noted that the gate oxide layer 30 on the non-MOSCAP region 14 is disposed directly on the surface of the substrate 12 and fin-shaped structure 20 while the gate oxide layer 30 on the MOSCAP region 16 could be disposed directly on the surface of the cap layer 26 or fin-shaped structures 20 depending on whether the cap layer 26 is removed.

Figure 6:
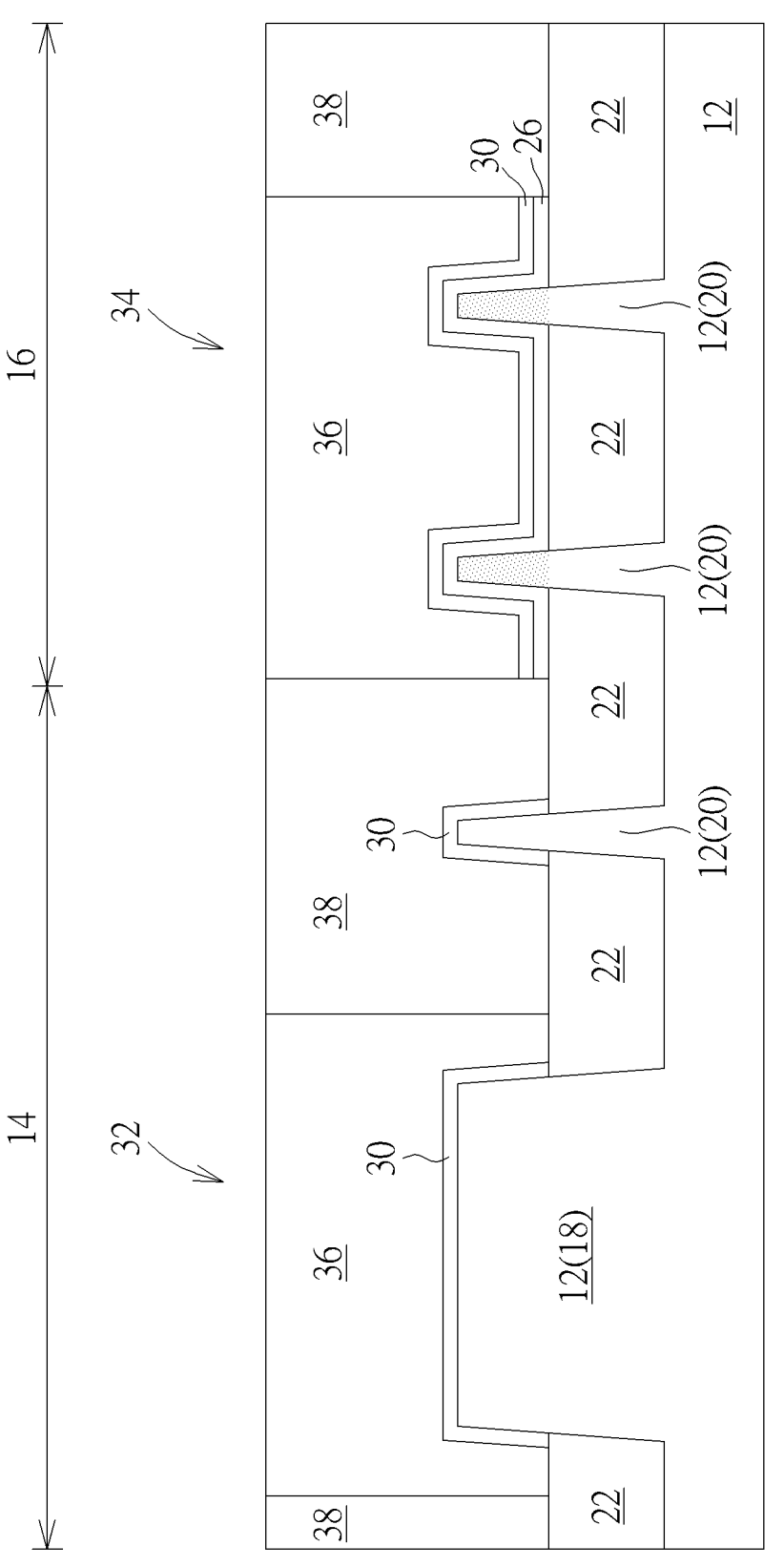

Next, as shown in FIG. 6, gate electrodes 32, 34 are formed on the substrate 12 and fin-shaped structures 20 on the non-MOSCAP region 14 and MOSCAP region 16 respectively, in which the gate electrode 32 formed on the non-MOSCAP region 14 could be served as gate electrode for I/O device or LV device, the gate electrode 34 formed on the MOSCAP region 16 could be used as top electrode for the MOSCAP device, and the formation of the gate electrodes 32, 34 could be accomplished by a gate first process, a high-k first approach from gate last process, or a high-k last approach from gate last process.

Since this embodiment pertains to a high-k last approach, a gate material layer 36 made of polysilicon and a selective hard mask (not shown) could be formed sequentially on the substrate 12, and a photo-etching process is then conducted by using a patterned resist (not shown) as mask to remove part of the gate material layer 36, part of the gate oxide layer 30, and part of the cap layer 26 through single or multiple etching processes. After stripping the patterned resist, gate electrodes 32, 34 each made of a patterned material layer 36 is formed on the substrate 12 and fin-shaped structures 20 of the non-MOSCAP region 14 and MOSCAP region 16.

Next, at least a spacer (not shown) is formed on the sidewalls of the each of the gate electrodes 32, 34, a source/drain region (not shown) and/or epitaxial layer is formed in the fin-shaped structures 20 and/or substrate 12 adjacent to two sides of the spacer on the non-MOSCAP region 14, and selective silicide layers (not shown) could be formed on the surface of the source/drain region. In this embodiment, the spacer could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain region could include n-type dopants or p-type dopants depending on the type of device being fabricated.

Next, an interlayer dielectric (ILD) layer 38 is formed on the gate electrodes 32, 34 and a planarizing process such as CMP is conducted to remove part of the ILD layer 38 for exposing the gate material layers 36 or gate electrodes 32, 34 made of polysilicon so that the top surface of the gate electrodes 32, 34 are even with the top surface of the ILD layer 38.

Figure 7:
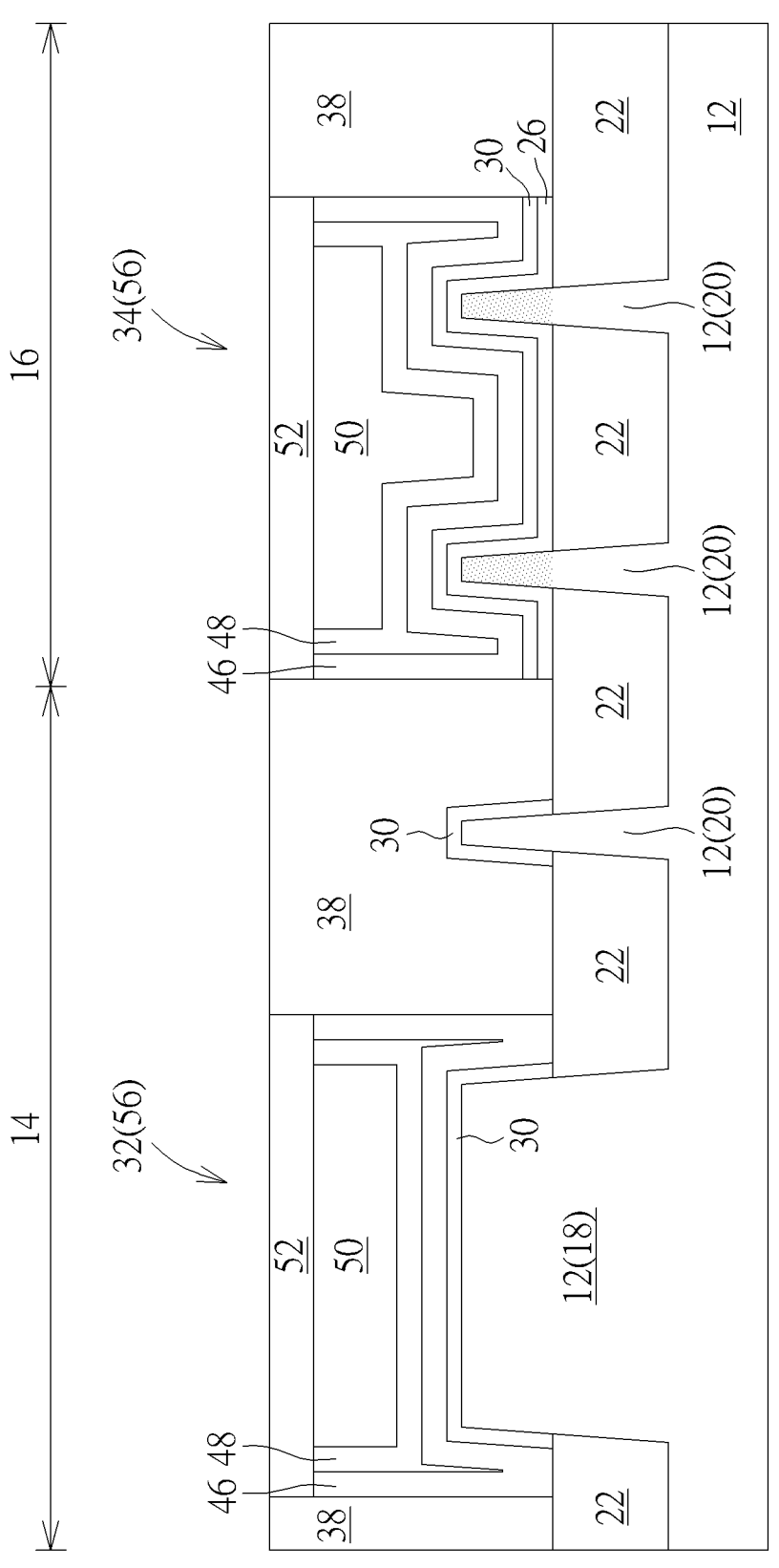

Next, as shown in FIG. 7, a replacement metal gate (RMG) process is conducted to transform the gate electrodes 32, 34 on the non-MOSCAP region 14 and MOSCAP region 16 into metal gates 56. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 36 and even gate oxide layer 30 for forming recesses (not shown) in the ILD layer 38.

Next, a selective interfacial layer (not shown) or gate dielectric layer, a high-k dielectric layer 46, a work function metal layer 48, and a low resistance metal layer 50 are formed in the recesses, and a planarizing process such as CMP is conducted to remove part of low resistance metal layer 50, part of work function metal layer 48, and part of high-k dielectric layer 46 to form metal gates 56. In this embodiment, the gate structures or metal gates 56 fabricated through high-k last process of a gate last process preferably includes an interfacial layer or gate oxide layer 30, a U-shaped high-k dielectric layer 46, a U-shaped work function metal layer 48, and a low resistance metal layer 50.

In this embodiment, the high-k dielectric layer 46 is preferably selected from dielectric materials having dielectric constant (k value) larger than 4. For instance, the high-k dielectric layer 46 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 48 is formed for tuning the work function of the metal gate in accordance with the conductivity of the device. For an NMOS transistor, the work function metal layer 48 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 48 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 48 and the low resistance metal layer 50, in which the material of the barrier layer may include titanium (Ti), titanium nitride (TiN), tantalum (Ta) or tantalum nitride (TaN). Furthermore, the material of the low-resistance metal layer 50 may include copper (Cu), aluminum (Al), titanium aluminum (TiAl), cobalt tungsten phosphide (CoWP) or any combination thereof.

Next, part of the high-k dielectric layer 46, part of the work function metal layer 48, and part of the low resistance metal layer 50 are removed to form recesses (not shown), and a hard mask 52 is formed into each of the recesses so that the top surfaces of the hard masks 52 and the ILD layer 38 are coplanar. Preferably the hard masks 52 could include $SiO_2$, SiN, SiON, SiCN, or combination thereof.

Next, a photo-etching process is conducted by using a patterned mask (not shown) as mask to remove part of the ILD layer 38 adjacent to the gate electrode 32 on the non-MOSCAP region 14 for forming contact holes (not shown) exposing the source/drain region underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs (not shown) electrically connecting the source/drain region. This completes the fabrication of a semiconductor device according to an embodiment of the present invention.

Figure 8:
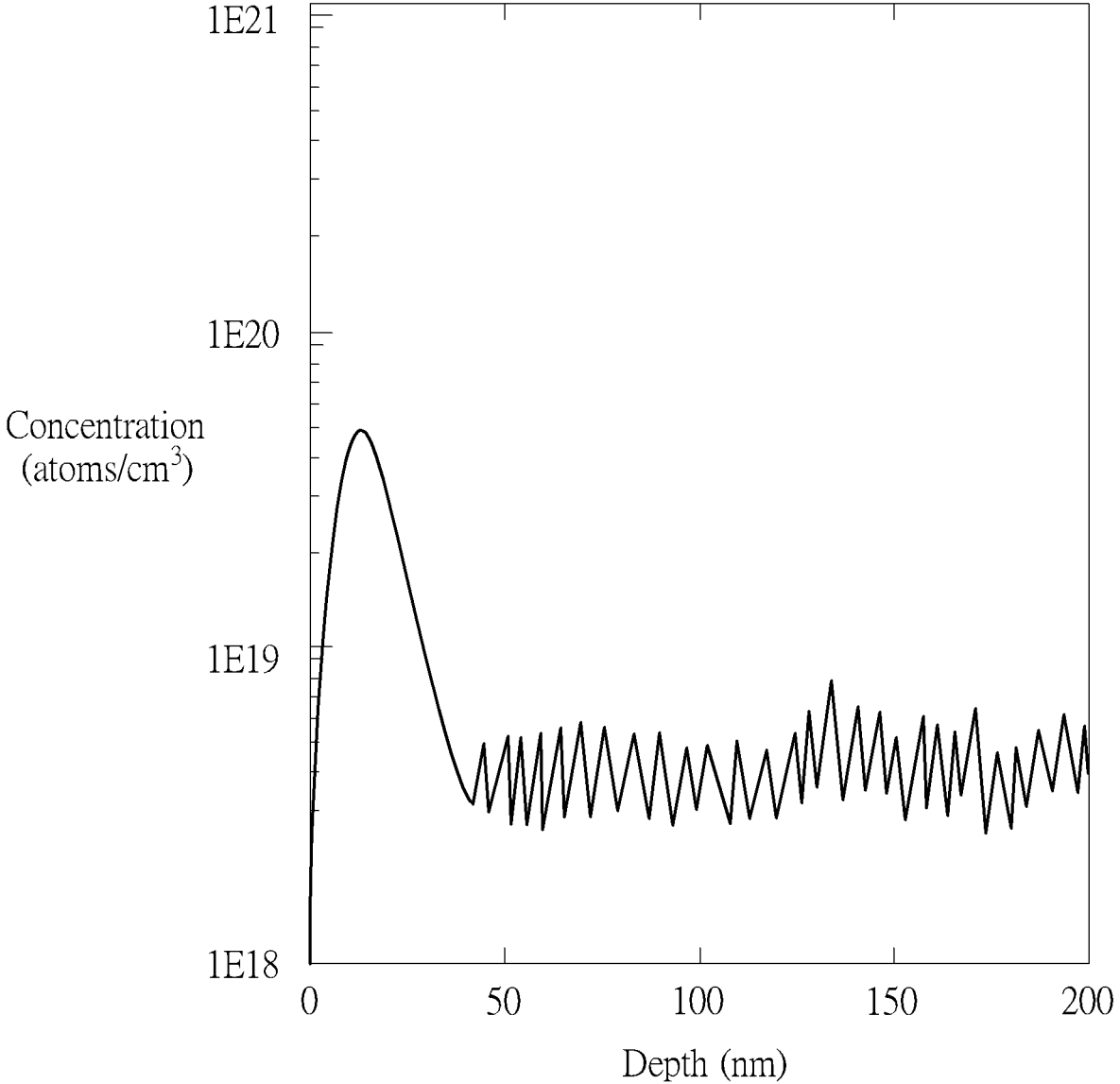
FIG. 8 illustrates a concentration distribution of dopants on the non-MOSCAP region.
Figure 9:
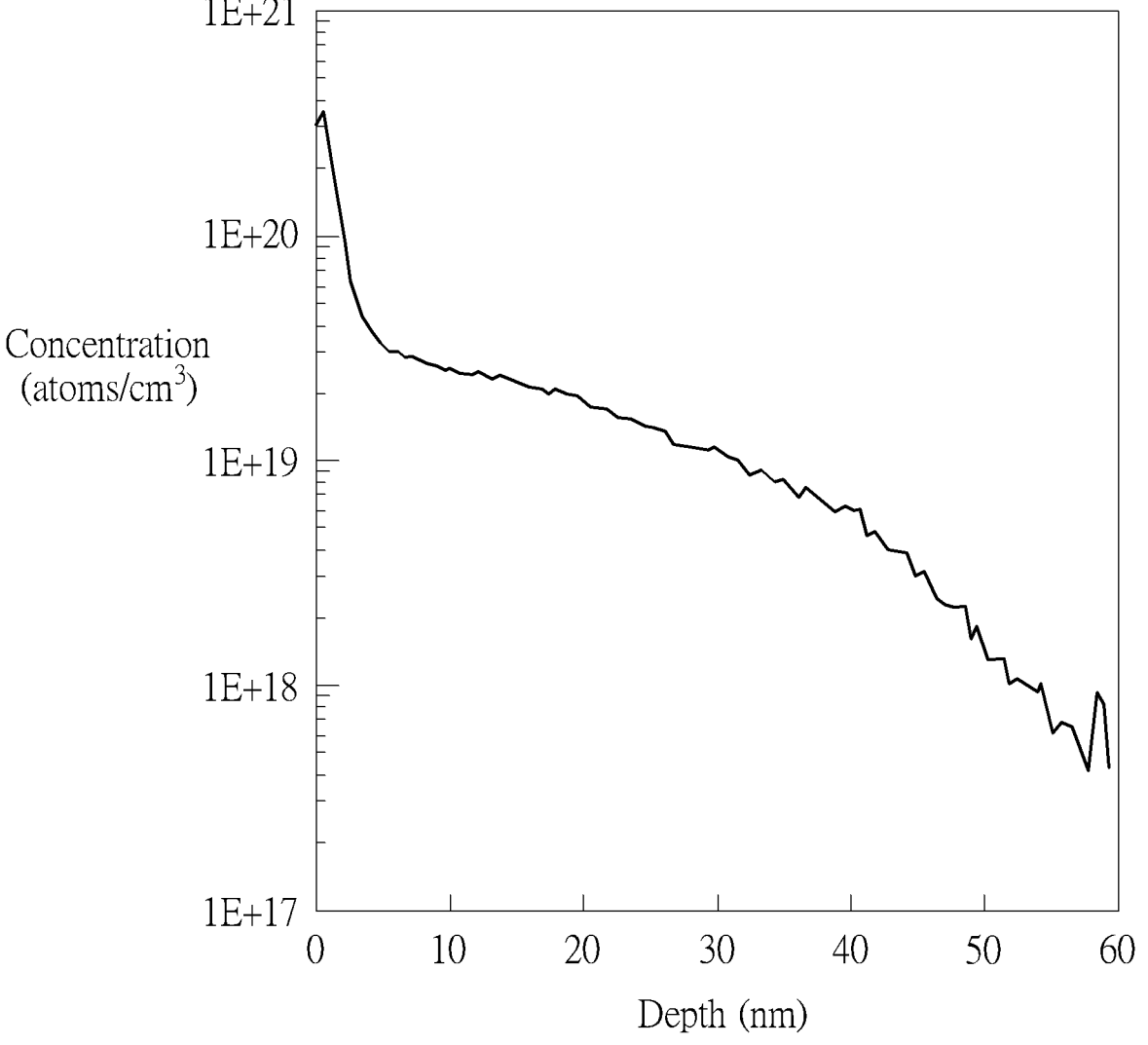
FIG. 9 illustrates a concentration distribution of dopants on the MOSCAP region.

Referring to FIGS. 7-9, FIG. 7 illustrates a structural view of a semiconductor device according to an embodiment of the present invention and FIGS. 8-9 illustrate concentration distributions on the non-MOSCAP region 14 and MOSCAP region 16 according to an embodiment of the present invention. As shown in FIG. 7, the semiconductor device includes a substrate 12 having a non-MOSCAP region 14 and a MOSCAP region 16, a MOS transistor disposed on the non-MOSCAP region 14, and a MOSCAP device disposed on the MOSCAP region 16. In this embodiment, the MOSCAP device includes a plurality of fin-shaped structures 20 disposed on the substrate 12, at least an insulating layer such as a combination of the gate oxide layer 30 and/or high-k dielectric layer 46 on the fin-shaped structures 20, and a gate electrode 34 disposed on the gate oxide layer 30. Preferably, the heavily doped fin-shaped structures 20 are served as a bottom electrode for the MOSCAP device, dielectric layers including the gate oxide layer 30 and/or high-k dielectric layer 46 are used as a capacitor dielectric layer for the MOSCAP device, and the gate electrode 34 is served as a top electrode for the MOSCAP device.

Despite the fin-shaped structures 20 on the non-MOSCAP region 14 and MOSCAP region 16 are fabricated through same process, the overall and/or maximum doping concentrations of the fin-shaped structures 20 on the non-MOSCAP region 14 however are both less than overall and/or maximum doping concentrations of the fin-shaped structures 20 on the MOSCAP region 16. Referring to FIGS. 8-9, FIG. 8 illustrates a concentration distribution within the fin-shaped structures 20 on the non-MOSCAP region 14 and FIG. 9 illustrates a concentration distribution within the fin-shaped structures 20 on the MOSCAP region 16, in which X-axis represents the depth of the fin-shaped structures while Y-axis represents concentration of dopants within the fin-shaped structures.

As shown in FIG. 8, since the non-MOSCAP region 14 typically involves employing standard ion implantation process to implant dopants into the fin-shaped structures 20, the concentration of dopants at surface of the fin-shaped structures 20 is less than the concentration at a first depth and a second depth, the concentration at the first depth being a maximum concentration, and the first depth is less than the second depth. For instance, the concentration of dopants at surface of the fin-shaped structures 20 on the non-MOSCAP region 14 or at depth 0 nm is approximately $1.0 \times 10^{18}$ atoms/$cm^3$ or most preferably between $5.0 \times 10^{17}$ atoms/$cm^3$ to $5.0 \times 10^{18}$ atoms/$cm^3$, the concentration of dopants at depth 20 nm is approximately $5.0 \times 10^{19}$ atoms/$cm^3$ or most preferably between $1.0 \times 10^{19}$ atoms/$cm^3$ to $1.0 \times 10^{20}$ atoms/$cm^3$, and the concentration of dopants at depth 50 nm is approximately $5.0 \times 10^{18}$ atoms/$cm^3$ or most preferably between $1.0 \times 10^{18}$ atoms/$cm^3$ to $1.0 \times 10^{19}$ atoms/$cm^3$.

Next, as shown in FIG. 9, since the dopants are driven into the fin-shaped structures 20 through MLD technique according to aforementioned embodiment and in contrast to the maximum concentration of the fin-shaped structures 20 on the non-MOSCAP region 14 appears at a depth lower than the surface of the fin-shaped structures 20, the maximum concentration of the fin-shaped structures 20 on the MOSCAP region 16 is appeared at the surface of the fin-shaped structures 20. For instance, the concentration of dopants at surface of the fin-shaped structures 20 on the MOSCAP region 16 or at depth 0 nm is approximately $5.0 \times 10^{20}$ atoms/$cm^3$ or most preferably between $1.0 \times 10^{20}$ atoms/$cm^3$ to $1.0 \times 10^{21}$ atoms/$cm^3$ while the concentration of dopants at depth 50 nm is between $8.0 \times 10^{17}$ atoms/$cm^3$ to $2.0 \times 10^{18}$ atoms/$cm^3$. In this embodiment, the concentration slope of the non-MOSCAP region 14 is slightly less than the concentration slope of the MOSCAP region 16 and a decrease from the maximum concentration to any concentration less than the maximum concentration on the MOSCAP region 16 is preferably shown by a much more steep drop such as an exponential decay.

Overall, the present invention discloses an approach of using MLD technique for fabricating MOSCAP device, which first forms multiple fin-shaped structures on a substrate of MOSCAP region, performs a wet chemical doping process to inject a precursor containing phosphorus onto the surface of the fin-shaped structures 20 for forming a doped layer, forms a cap layer on the doped layer, an then conducts an anneal process to transfer the dopants from the doped layer into the fin-shaped structures and at the same time consumes the entire doped layer to reveal the surface of the fin-shaped structures. By using this approach to fabricate MOSCAP device, the maximum concentration of dopants in the fin-shaped structures on the MOSCAP region 16 would appear at the surface of the fin-shaped structures while the maximum concentration of dopants in the fin-shaped structures on the non-MOSCAP region 14 would appear at a depth lower than the surface of the fin-shaped structure. Moreover, the approach of using MLD process to inject dopants into the fin-shaped structures could result in much less damage to the fin-shaped structures than conventional means of implanting dopants into the fin-shaped structures through ion implantation process directly and the performance of the MOSCAP device could also be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate comprising a non-metal-oxide (non-MOSCAP) region and a MOSCAP region;

a first fin-shaped structure on the non-MOSCAP region, wherein the first fin-shaped structure comprises a maximum concentration of dopants at a first depth; and
   a second fin-shaped structure on the MOSCAP region, wherein the second fin-shaped structure comprises a maximum concentration of dopants at a surface thereof.

2. The semiconductor device of claim 1, further comprising:
   a gate oxide layer on the first fin-shaped structure and the second fin-shaped structure; and
   a first gate electrode on the non-MOSCAP region and a second gate electrode on the MOSCAP region.

3. The semiconductor device of claim 1, wherein the first fin-shaped structure comprises a first concentration at a surface thereof, the maximum concentration at the first depth, and a second concentration at a second depth.

4. The semiconductor device of claim 3, wherein the first concentration is less than the second concentration.

5. The semiconductor device of claim 3, wherein the first depth is less than the second depth.

6. The semiconductor device of claim 3, wherein the non-MOSCAP region comprises an input/output (I/O) region and a low-voltage (LV) region.

7. The semiconductor device of claim 1, wherein the second fin-shaped structure comprises a third concentration at a third depth.

8. The semiconductor device of claim 7, wherein a decrease from the maximum concentration to the third concentration comprises an exponential decay.

9. The semiconductor device of claim 1, wherein the maximum concentration of dopants in the first fin-shaped structure is less than the maximum concentration of dopants in the second fin-shaped structure.

* * * * *